US012756386B2

(12) United States Patent
Roig-Guitart et al.

(10) Patent No.: US 12,756,386 B2
(45) Date of Patent: Oct. 6, 2026

(54) INTEGRATED RESISTOR-TRANSISTOR-CAPACITOR SNUBBER

(71) Applicant: SEMICONDUCTOR COMPONENTS INDUSTRIES, LLC, Scottsdale, AZ (US)

(72) Inventors: Jaume Roig-Guitart, Oudenaarde (BE); Dean E. Probst, West Jordan, UT (US); Ashok Challa, Milpitas, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 73 days.

(21) Appl. No.: 18/310,153

(22) Filed: May 1, 2023

(65) Prior Publication Data

US 2023/0403003 A1 Dec. 14, 2023

Related U.S. Application Data

(60) Provisional application No. 63/366,198, filed on Jun. 10, 2022.

(51) Int. Cl.
*H03K 17/16* (2006.01)
*H03K 17/0412* (2006.01)
(Continued)

(52) U.S. Cl.
CPC ..... *H03K 17/161* (2013.01); *H03K 17/04123* (2013.01); *H10D 30/668* (2025.01); *H10D 84/811* (2025.01); *H10D 84/83* (2025.01)

(58) Field of Classification Search
CPC ........... H03K 17/161; H03K 17/04123; H03K 2217/0036; H03K 17/08142;
(Continued)

(56) References Cited

U.S. PATENT DOCUMENTS 5,338,969 A * 8/1994 Kaya ..................... H10B 69/00 257/659
5,923,513 A 7/1999 Pelly
(Continued)

FOREIGN PATENT DOCUMENTS

WO 2020106964 A1 5/2020

OTHER PUBLICATIONS

Chen, "Design Optimal Built-in Snubber in Trench Field Plate Power MOSFET for Superior EMI and Efficiency Performance", In 2015 International Conference on Simulation of Semiconductor Processes and Devices (SISPAD), IEEE, pp. 459-462.
(Continued)

*Primary Examiner* — Metasebia T Retebo
(74) *Attorney, Agent, or Firm* — Brake Hughes Bellermann LLP

(57) ABSTRACT

A circuit includes a metal-oxide semiconductor field-effect transistor (MOSFET) and a snubber circuit coupled between a drain and a source of the MOSFET. The snubber circuit includes a transistor disposed in parallel to the MOSFET. The transistor has a floating gate. The circuit further includes a capacitor in series with the transistor, and a resistor disposed parallel to the capacitor.

19 Claims, 9 Drawing Sheets

600

(51) Int. Cl.
*H10D 30/66* (2025.01)
*H10D 84/80* (2025.01)
*H10D 84/83* (2025.01)

(58) Field of Classification Search
CPC ............... H01L 27/0629; H01L 27/088; H01L 29/7813; H02M 1/34; H02M 1/322
See application file for complete search history.

(56) References Cited

U.S. PATENT DOCUMENTS

| | | | | |
|---|---|---|---|---|
| 6,153,463 | A * | 11/2000 | Wei | H10D 1/66 257/E29.345 |
| 8,643,071 | B2 * | 2/2014 | Pan | H10D 30/668 257/302 |
| 2007/0138544 | A1 | 6/2007 | Hirler et al. | |
| 2008/0017920 | A1 | 1/2008 | Sapp et al. | |
| 2008/0017967 | A1 | 1/2008 | Bauer et al. | |
| 2008/0179670 | A1 | 7/2008 | Willmeroth et al. | |
| 2009/0166720 | A1 | 7/2009 | Zundel | |
| 2010/0163950 | A1 * | 7/2010 | Gladish | H10D 30/668 257/302 |
| 2014/0292287 | A1 | 10/2014 | Rutter et al. | |
| 2016/0118380 | A1 | 4/2016 | Lui et al. | |
| 2017/0236934 | A1 * | 8/2017 | Rankila | H10D 64/2527 438/468 |
| 2020/0152407 | A1 * | 5/2020 | Askan | H01H 9/542 |
| 2021/0381888 | A1 * | 12/2021 | Beuville | G01J 1/46 |
| 2023/0163587 | A1 * | 5/2023 | Lu | H03K 17/08142 361/93.1 |

OTHER PUBLICATIONS

Severns, et al., "Design of snubbers for power circuits", 2006, International Rectifier Corporation, 29 pages.
Yamashita, et al., "Low noise superjunction MOSFET with integrated snubber structure", In 2018 IEEE 30th International Symposium on Power Semiconductor Devices and ICs (ISPSD), pp. 32-35.
Chung , "Designing the Resistor-Capacitor-Diode (RCD) Snubber of a Flyback Converter", 2014, 2 pages; available at https://www.planetanalog.com/designing-the-resistor-capacitor-diode-rcd-snubber-of-a-flyback-converter/.
Power MOSFET Selecting MOSFFETs and Consideration for Circuit Design. Toshiba Application Notes, 18 pages.
Extended European Search Report for counterpart EP Patent Application No. 23171577.2, mailed Nov. 9, 2023, 9 pages.

* cited by examiner

200

300

500

600

700

800

900

INTEGRATED RESISTOR-TRANSISTOR-CAPACITOR SNUBBER

RELATED APPLICATION

This application claims priority to and the benefit of U.S. Provisional Application No. 63/366,198, filed Jun. 10, 2022, which is incorporated by reference in its entirety herein.

TECHNICAL FIELD

This description relates to semiconductor devices and, more particularly, to transistor devices, such as metal-oxide semiconductor field-effect transistors implemented with a snubber circuit.

BACKGROUND

Power transistors are used in consumer electronics, automotive electronics, industrial electronics, etc. For example, power transistors are used in power conversion circuits, such as a direct-current to direct-current (DC to DC) power converter (e.g., a synchronous buck converter), where a power output of the converter is coupled to a switch node between a high-side (HS) transistor and a low-side (LS) transistor. Parasitic inductances in the HS and LS transistors (e.g., vertical trench metal-oxide semiconductor field-effect transistors (MOSFETs)) and/or in a printed circuit board (PCB) used to implement a power converter, combined with an output capacitance of the LS transistor ($C_{oss}$) can cause overshoot and/or ringing at the switch node. Such overshoot and/or ringing can cause a voltage on the switch node to exceed a breakdown voltage of the LS transistor, such as a drain-to-source breakdown voltage ($BV_{dss}$) of a LS MOSFET. When $BV_{dss}$ is exceeded, a power conversion efficiency of the power converter can be reduced and/or the transistor can be damaged. In implementations in which the MOSFETs include shielded gates, low shield resistance can reduce losses associated with shield displacement currents but can also increase contributions to overshoot.

SUMMARY

A circuit includes a metal-oxide semiconductor field-effect transistor (MOSFET) and a snubber circuit coupled between a drain and a source of the MOSFET. The snubber circuit includes a transistor disposed in parallel to the MOSFET. The transistor has a floating gate. The circuit further includes a capacitor in series with the transistor, and a resistor disposed parallel to the capacitor.

A semiconductor die includes a metal-oxide semiconductor field-effect transistor (MOSFET) including a gate, a source, and a drain. The semiconductor die further includes a snubber circuit including a transistor disposed in parallel to the MOSFET between the source and the drain of the MOSFET. The transistor has a floating gate.

A method includes disposing a snubber circuit in parallel with a switching element. The snubber circuit includes a snubber transistor with a floating gate. The method further includes integrating the snubber circuit with the switching element on a semiconductor die, and capacitively coupling a voltage on a drain of the switching element to the floating gate of the snubber transistor.

BRIEF DESCRIPTION OF THE DRAWINGS

Like reference symbols in the various drawings indicate like and/or similar elements.

DETAILED DESCRIPTION

Figure 1:
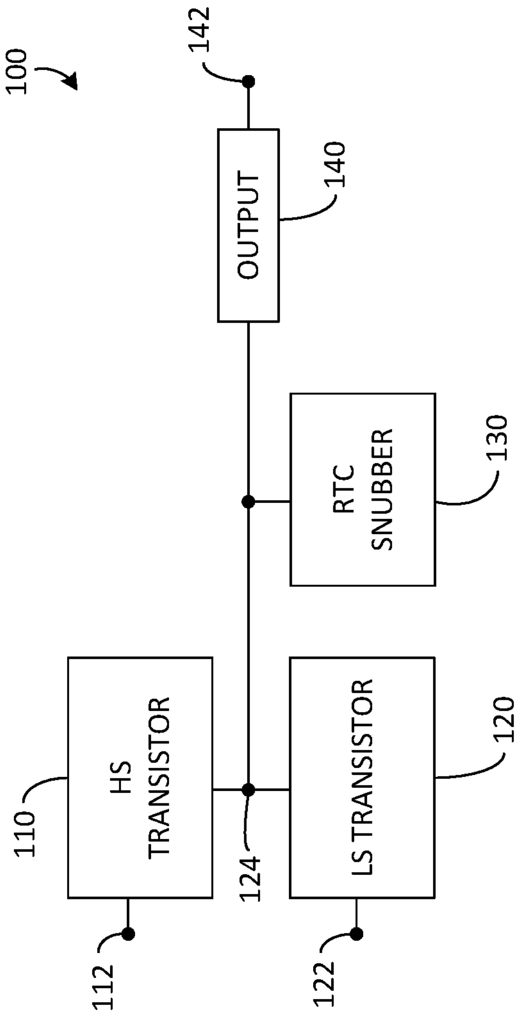
FIG. 1 is a block diagram illustrating a power converter including a Resistor-Transistor-Capacitor (RTC) snubber circuit.

This disclosure is directed to circuits and devices, e.g., semiconductor devices, that can be implemented in a power converter, such as direct-current to direct-current (DC-DC) power converter. The circuits and devices described herein, as compared to previous approaches, can reduce overshoot and/or ringing on a switch node (e.g., in an associated power converter) while also reducing power conversion efficiency losses. For instance, the circuits and devices described herein that include, or can be used to implement a Resistor-Transistor-Capacitor (RTC) snubber circuit that can be integrated with a transistor, such as a metal-oxide-semiconductor field-effect transistor (MOSFET) of a switching circuit in the power convertor.

The implementations described herein have advantages over approaches used to prevent such reduction of power efficiency loss and/or potential transistor damage, e.g., for a given implementation, by increasing $BV_{dss}$ of the LS transistor. Increasing $BV_{dss}$ also increases on-state resistance of the LS transistor, such as drain-to-source on-state resistance (Rdson), which results in higher resistive losses, and decreases power conversion efficiency.

The implementations described herein have advantages over approaches to reduce overshoot and/or reduce ringing by coupling additional capacitors and/or resistors to a switch node of an associated power converter. Charging and discharging such extra capacitors in correspondence with a voltage on the switch node contributes to power conversion efficiency losses. Additionally, such extra capacitors take up PCB space (e.g., increasing production costs) and add more parasitic inductance to the circuit, which can be counterproductive to reducing overshoot and/or ringing.

The components of the RTC snubber circuit may be indicated herein by the prefix snubber for example, the transistor in the RTC circuit is referred to herein as the snubber transistor, the capacitor in the RTC circuit is referred to herein as the snubber capacitor and the resistor in the RTC circuit is referred to herein as the snubber resistor. The RTC snubber circuit may include a snubber capacitor connected in series to the snubber transistor and a snubber resistor (e.g., a bleeding resistor) connected in parallel to the capacitor. In example implementations, at least the snubber transistor of a RTC snubber circuit may be integrated (i.e., formed in a same semiconductor die) as a MOSFET (LS transistor, HS transistor, or other transistor) that forms the switching transistor (e.g., a low-side (LS) transistor or a high-side (HS) transistor) in a power converter. In some example implementations, the snubber capacitor and the snubber resistor may also be integrated on the same semiconductor die as the snubber transistor. In some example implementations, the snubber capacitor and or the snubber resistor may not be integrated on a same semiconductor die as the switching transistor but may be formed, for example, in a separate device circuit (e.g., a Metal-Insulator-Metal (MIM) device circuit) attached to switching transistor in the power converter.

In example implementations, the RTC snubber circuit may be connected in parallel to the MOSFET (LS transistor, HS transistor, or other transistor) that forms the switching transistor (e.g., a low-side (LS) transistor or a high-side (HS) transistor) in a power converter. In example implementations, the snubber transistor can itself be a MOSFET with a floating gate (i.e., without a driver connected to the gate). In example implementations, the snubber transistor can itself be a field effect transistor (FET or MOSFET) with a floating gate (i.e., without a driver being connected to the gate). In example implementations, the floating gate of the snubber transistor may be capacitively coupled (e.g., by material of the semiconductor die) to the drain of the MOSFET (LS transistor, HS transistor, or other transistor) that forms the switching transistor (e.g., a low-side (LS) transistor or a high-side (HS) transistor) in the power converter. A switch node voltage in the power converter (e.g., a voltage on a drain of the MOSFET (LS transistor)) may be capacitively coupled to the floating gate and result in a smaller voltage a (coupled gate voltage) appearing on the floating gate. When this coupled gate voltage (i.e., gate-to-source voltage Vgs) exceeds a minimum Vgs (i.e., a threshold voltage Vth of the snubber transistor), the transistor may begin to conduct through a channel between the drain and source of the transistor.

In the approaches described herein, a RTC snubber can be configured to operate such that the capacitor of the RTC snubber charges when a switch node voltage in the power converter (e.g., a voltage on a drain of the MOSFET (LS transistor, or HS transistor)) results in a coupled gate voltage on the floating gate of the snubber transistor that exceeds the minimum Vgs (i.e., threshold voltage Vth) of the snubber transistor. The coupled gate voltage being greater than the transistor threshold voltage turns on the snubber transistor to supply current (charge) through the transistor channel to the snubber capacitor. The snubber capacitor discharges (through the snubber resistor) when the switch node voltage in the power converter (e.g., a voltage on a drain of the MOSFET (LS transistor or HS transistor)) is lowered (drops) resulting in a coupled gate voltage that is below the gate-to-source threshold voltage of the snubber transistor. When the coupled gate voltage (gate-source voltage) is below the snubber transistor threshold voltage (Vth), the snubber transistor turns off and stops supplying current (charge) to the snubber capacitor. In such approaches, the snubber transistor threshold voltage can, by design, be less than a capacitively coupled voltage (on the floating gate) corresponding to a breakdown voltage of the LS transistor or the HS transistor (e.g., a drain-to-source breakdown voltage ($BV_{dss}$) of a LS MOSFET).

For instance, in example implementations, the RTC snubber circuit can be configured such that it snubs voltage and/or current on the switch node (e.g., by charging the snubber capacitor) to prevent overshoot and/or ringing when the switch node voltage results in a floating gate-source voltage exceeding the threshold voltage of snubber transistor, and discharges and/or prevents charging of the snubber capacitor when the switch node voltage results in a floating gate-source voltage below the threshold voltage of snubber transistor. In such implementations, when the switch node voltage corresponds to a capacitively coupled gate voltage less than the threshold voltage of the snubber transistor, the snubber resistor can conduct leakage current to reduce or prevent charging of the capacitor and/or to discharge the capacitor. Further, charge stored on the capacitor of the RTC snubber circuit can be delivered back to the switch node when a voltage difference between a stored voltage of the capacitor and a voltage of switch node exceeds a forward (turn-on) voltage of the snubber transistor.

In the approaches described herein, the RTC snubber circuit activates (snubs voltage and/or current on the switch node) when the switch node voltage corresponds to a capacitively coupled voltage on the floating gate of the snubber transistor that is above the snubber transistor threshold value Vth. Therefore, efficiency losses associated with continual capacitor charging and discharging in correspondence with a cycling switch node voltage can be reduced.

FIG. 1 is a block diagram illustrating a power converter circuit 100 according to an implementation. The power converter circuit 100 is shown by way of example and for purposes of illustration. In some implementations, power converter circuit 100 can include other elements not specifically shown, such as a control circuit and/or passive circuit elements.

In this example, the power converter circuit 100 includes a high-side (HS) transistor 110, a LS transistor 120, a RTC snubber circuit 130 and an output circuit 140. In some implementations, HS transistor 110 and LS transistor 120 can be implemented using respective power MOSFETs, such as vertical power MOSFETs that are implemented in a corresponding semiconductor device, semiconductor devices. For instance, such vertical power MOSFETs can be implemented in a semiconductor substrate (semiconductor region). A terminal 112 can be configured to receive a signal (e.g., from a power converter control circuit) for controlling the HS transistor 110. For instance, the terminal 112 can be a gate terminal of a HS power MOSFET (e.g., a conductive electrode disposed on a dielectric layer). Likewise, a terminal 122 can be configured to receive a signal (e.g., from a power converter control circuit) for controlling LS transistor 120. For instance, terminal 122 can be a gate terminal of a LS power MOSFET. While the RTC snubber circuit 130 of FIG. 1 is shown as being associated with LS transistor 120, in some implementations, such an RTC snubber circuit can also be associated with HS transistor 110.

As shown in FIG. 1, HS transistor 110 and LS transistor 120 are coupled at a switch node 124 of power converter circuit 100. For instance, in implementations of power converter circuit 100 including power MOSFETs, a source of the HS transistor 110 and a drain of the LS transistor 120 can be coupled by switch node 124. Further in the example of FIG. 1, the RTC snubber circuit 130 and output circuit 140 are coupled at switch node 124. In some implementations, RTC snubber circuit 130 can be implemented using the circuits and/or devices described herein. Output circuit 140 can be a circuit configured to regulate an output voltage of the power converter, and the output voltage can be provided to a corresponding circuit load on a terminal 142. In some implementations, the output circuit 140 can be an inductor-capacitor (LC) circuit.

Figure 2:
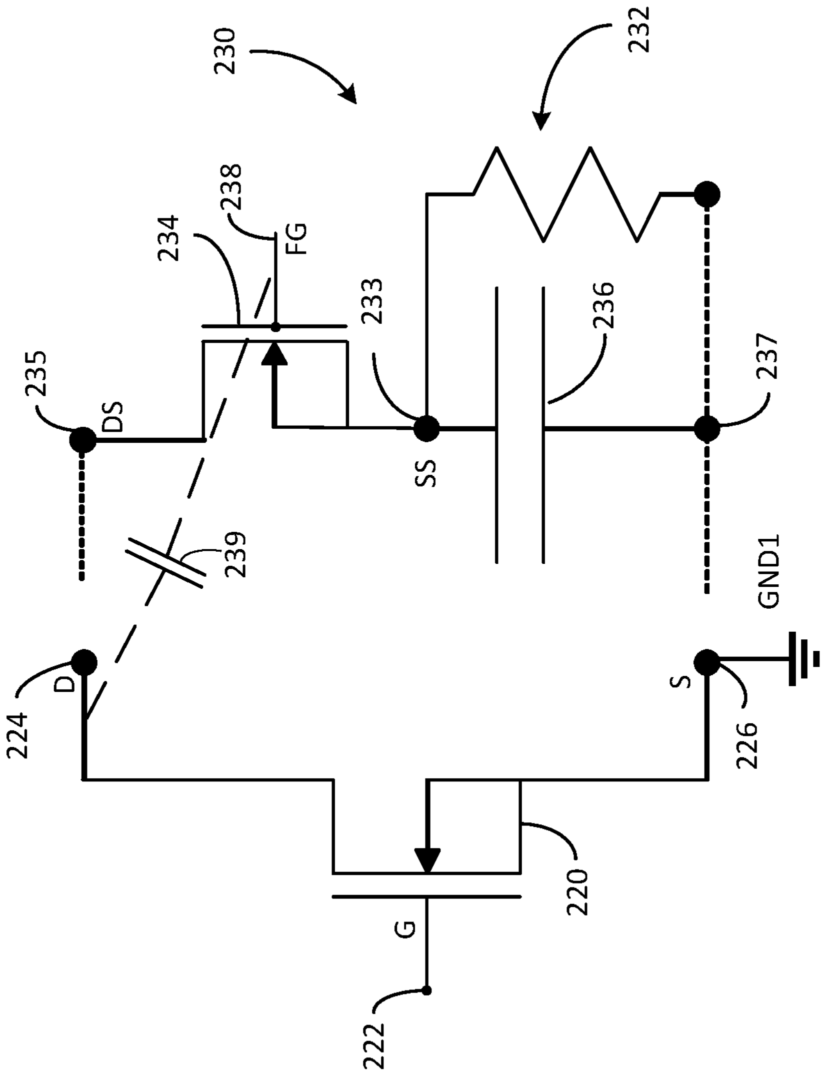
FIG. 2 is a schematic diagram illustrating a circuit illustrating a low-side (LS) transistor and integrated RTC snubber circuit that can be implemented in the power converter of FIG. 1.
Figure 3:
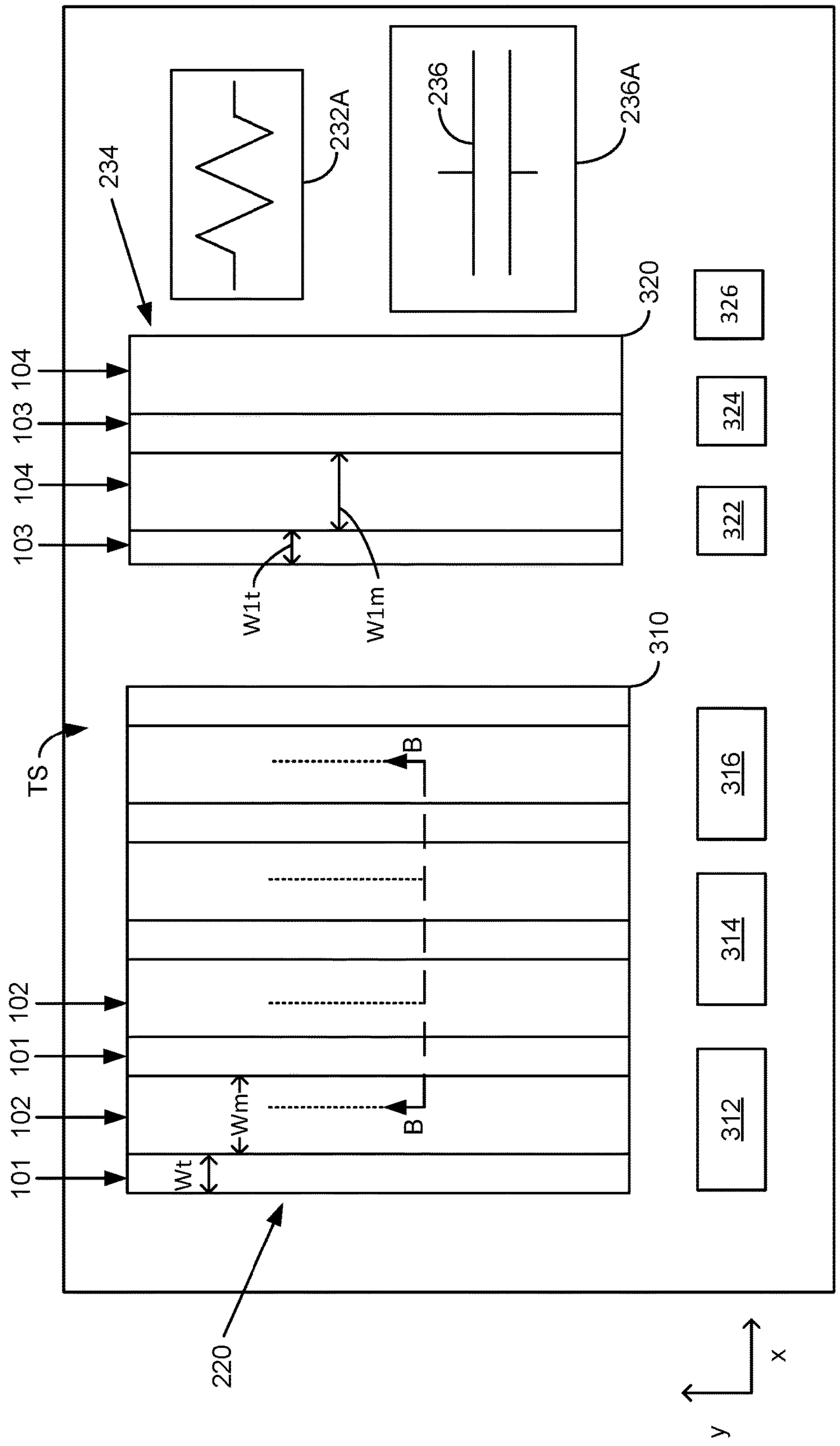
FIG. 3 illustrates a plan view of semiconductor die including a MOSFET and a snubber transistor.

FIG. 2 is a schematic diagram illustrating a power converter circuit 200 including a LS MOSFET 220 integrated with a RTC snubber circuit 230 that can be used, respectively, to implement, for example, LS transistor 120 and RTC snubber circuit 130 of power converter circuit 100 (FIG. 1). In example implementations, LS transistor 120 may be a vertical trench shielded gate MOSFET device fabricated in trenches in a semiconductor die (FIG. 3).

As illustrated in FIG. 2, LS MOSFET 220 includes a gate G (e.g., gate node 222) (gate terminal, gate connection, etc.), a drain D (e.g., drain node 224) (drain terminal, drain connection, etc.), and a source S (e.g., source node 226) (source terminal, source connection, etc.). In some implementations, LS MOSFET 220 can be a vertical power MOSFET implemented in a semiconductor region and/or a semiconductor substrate (hereafter "semiconductor region"), where drain node 224 is included in the semiconductor region (e.g., a backside drain), while connections to gate node 222 and source node 226 are provided, for example, through metallization (not shown), on a front side (top side) of the semiconductor region. In this example, drain node 224 can be coupled with a switch node of an associated power converter (e.g., switch node 124 of power convertor circuit 100 (FIG. 1)), and source node 226 can be coupled with an electrical ground GND1.

As shown in FIG. 2, RTC snubber circuit 230 includes a snubber resistor 232, a snubber transistor 234, and a snubber capacitor 236. In RTC snubber circuit 230, a source SS of snubber transistor 234 is coupled to a drain node 233, while a drain DS of snubber transistor 234 is coupled to a node 235. Snubber transistor 234 may include a floating gate FG (e.g., snubber gate 238) that is not directly coupled to a circuit node but may be capacitively coupled to the drain D (drain node 224) of LS MOSFET 220 (e.g., by the materials of the semiconductor die in which LS MOSFET 220 and snubber transistor 234 are fabricated). In FIG. 2, the capacitive coupling between LS MOSFET 220 and the floating gate FG (snubber gate 238) of snubber transistor 234 is symbolic represented by capacitor 239 connected between drain node 224 and floating gate 238.

Figure 7:
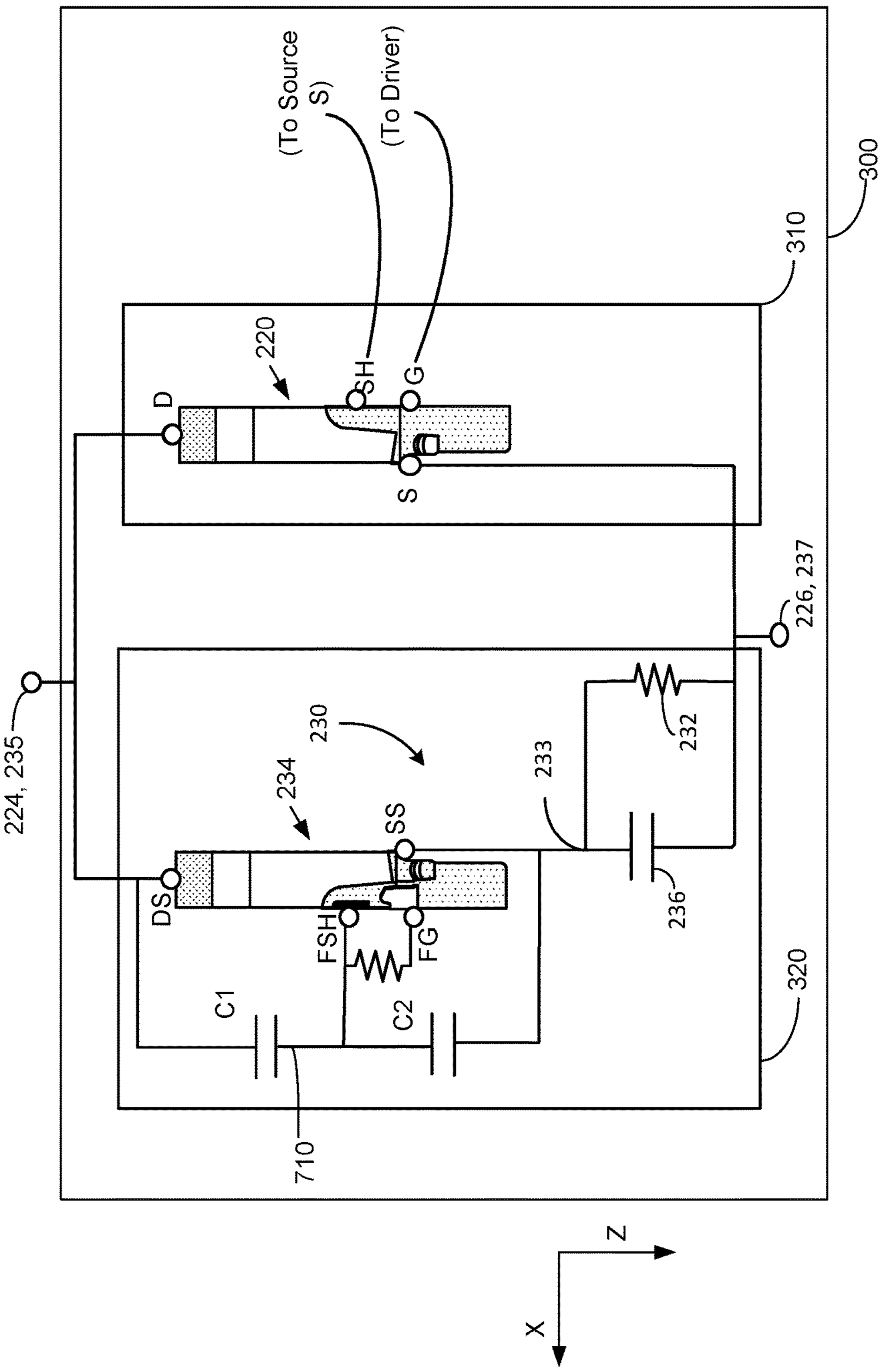

Also, in RTC snubber circuit 230, a first terminal of snubber capacitor 236 is coupled to source node 233 (source SS of snubber transistor 234), while a second terminal of snubber capacitor 236 is coupled to a node 237. While snubber capacitor 236 is shown as a single capacitor in FIG. 2, in some implementations the capacitor 236 can represent a lumped capacitance, e.g., where the capacitor 236 is implemented using multiple capacitors coupled in parallel and or in series with each other (FIG. 7, etc.). Snubber resistor 232 of the RTC snubber circuit 230 is coupled between node 233 (source SS of snubber transistor 234) and node 237 (the second terminal of the snubber capacitor 236) in parallel to snubber capacitor 236 As further shown in FIG. 2, RTC snubber circuit 230 can be integrated with the LS MOSFET 220 by coupling drain node 235 with drain node 224 of LS MOSFET 220 (e.g., to a switch node of a power converter), and coupling node 237 with source S (source node 226) of the LS MOSFET 220 (e.g., to electrical ground).

As mentioned previously, in example implementations, LS MOSFET 220 and snubber transistor 234 may be fabricated as shielded gate vertical trench MOSFETS in a same semiconductor die. FIG. 3 shows, for example, a plan view of semiconductor die 300 (e.g., a semiconductor substrate) in which LS MOSFET 220 and snubber transistor 234 are formed.

In semiconductor die 300, LS MOSFET 220 may be formed in an active area 310 on a top surface of semiconductor die 300, and snubber transistor 234 may be formed in an active area 320 on the top surface TS of semiconductor die 300 (e.g., a semiconductor substrate). In some example implementations, other elements of RTC snubber circuit 130 (e.g., snubber capacitor 236 and snubber resistor 232) also may be integrated (i.e., fabricated) in the semiconductor die. FIG. 3 schematically illustrates snubber capacitor 236 and snubber resistor 232 that may be fabricated, for example, in areas 236A and 232A of the semiconductor die. Snubber capacitor 236 may be formed, for example, by disposing a dielectric layer (e.g., oxide) between two conductive plates. Snubber resistor 232 may be formed, for example, by disposing a resistive element between two conductive terminals.

In example implementations, active area 320 in which the snubber transistor 234 is fabricated may have an area that is less than fifteen percent (e.g., 10%) of an area of active area 310 in which LS MOSFET 220 is fabricated. In example implementations, the active area 310 in which LS MOSFET 220 is fabricated may be in a range of 0.2 mm2 to 1.0 mm2 (e.g., 0.5 mm2). In example implementations, snubber capacitor 236 fabricated (integrated) in the semiconductor die may have a value that is less than a few nano Farads (e.g., less than 3 nF) (e.g., 1.2 nF).

In example implementations, LS MOSFET 220 may have a breakdown voltage $BV_{dss}$ in a range of about 8 to 20 volts (e.g., 12 volts) and configured for a current load (Iload) in a range of 2 A to 40 A (e.g., 15 A).

For convenience in description, the relative orientations or coordinates of features (e.g., trenches 101, mesas 102, trenches 103, mesa 104, etc.) of the disclosed trench MOSFET devices may be described herein with reference to the x axis and y axis shown, for example, on the page of FIG. 3. The direction perpendicular to the x-y plane of the page (e.g., the z axis) may be referred to as the vertical direction or axis. The z direction can be a direction downward into a depth of the semiconductor substrate and can be aligned in a direction of, for example, a depth of a trench in a MOSFET device fabricated in the semiconductor substrate. Further, for visual clarity, a limited number of trenches/device cells (e.g., 3-5 trenches/device cells) of the arrays of trenches/device cells shown in FIG. 3. As previously noted, an actual MOSFET device may include arrays of hundreds or thousands of trenches/device cells, which may be obtained, for example, by repeating (e.g., in the x direction) the limited array structures shown in example plan view in FIG. 3.

Semiconductor die 300, as shown in FIG. 3, includes a number of active trenches (i.e., longitudinal trenches 101, 103) of the device running parallel (e.g., substantially parallel) to each other (e.g., in a y direction). For example, mesas 102 may be formed between pairs of the longitudinal trenches 101, and mesas 104 may be formed between pairs of the longitudinal trenches 103. Trenches 101 and trenches 103 may be linear trenches (running, for example, in the y direction), and mesas 102 and mesas 104 may be linear mesas (also running, for example, in the y direction). Trenches 101 and mesa 102 may have uniform widths Wt and Wm (e.g., horizontal widths in the x direction), respectively. Trenches 103 and mesas 104 may have uniform widths W1$t$ and W1$m$ (e.g., horizontal widths in the x direction), respectively. The widths Wt and Wm of the trenches and mesas in active area 310 may be the same as, or different than the widths W1$t$ and W1$m$ of the trenches and mesas in active area 320.

Device elements (e.g., source and body regions (not shown)) of LS MOSFET 220 and snubber transistor 234 may be formed in mesas 102, 104 and contacted, for example, by source metal (not shown) at source contact regions. The device elements (e.g., the source and body regions) may be formed, for example, by n-type source and drain (NSD) implants in a p-type semiconductor substrate.

While only a few trenches 101 and mesas 102 (e.g., five trenches and four mesas) in active area 310 and only a few trenches 103 and mesas 104 (e.g., two trenches and two mesas) in active area 320 are shown in FIG. 3, it is noted that an actual MOSFET device may include arrays of hundreds or thousands of trenches/device cells, which may be obtained, for example, by repeating (e.g., in the x direction) the trench and mesa structures or patterns shown in the figures.

In the MOSFET devices (e.g., LS MOSFET 220, snubber transistor 234), a gate electrode provides turn-on and turn-off control of the device in response to an applied gate voltage. For example, in an N-type enhancement mode MOSFET, turn-on occurs when a conductive N-type inversion layer (i.e., channel region) is formed in a p-type body region in response to a positive gate voltage, which exceeds an inherent threshold voltage. The inversion layer connects N-type source regions to N-type drain regions and allows for majority carrier conduction between these regions.

In a trench MOSFET device (e.g., LS MOSFET 220, snubber transistor 234), a gate electrode is formed in a trench (e.g., for LS MOSFET 220 in trench 101 in active area 310, for snubber transistor 234 in trench 103 in active area 320) that extends downward (e.g., vertically downward) from a major surface of a semiconductor material (also can be referred to as a semiconductor region) such as silicon. Further, a shield electrode (or shield plate) may be formed below the gate electrode in the trench (and insulated via an inter-electrode or inter-poly dielectric). Current flow in a trench MOSFET device is primarily vertical (e.g., in an N doped drift region) and, as a result, device cells can be more densely packed. A device cell may, for example, include a trench that contains the gate electrode and the shield electrode, and an adjoining mesa that contains the drain, source, body, and channel regions of the device.

Packing several device cells together increases the current carrying capability and reduces on-resistance of the device. An example trench MOSFET device may include an array of hundreds or thousands of device cells (each including a trench and an adjoining mesa). A device cell may be referred to herein as a trench-mesa cell because each device cell geometrically includes a trench and a mesa (or two half mesas) structures. Shield and gate electrodes may be formed inside of a linear trench (e.g., trench 101) running along (e.g., aligned along) a mesa (e.g., mesa 102). The shield and gate electrodes may be made of polysilicon (e.g., "n+ shield poly silicon" and "n+ gate poly silicon") and isolated from each other by a dielectric layer (e.g., an inter-poly dielectric (IPD) layer. The IPD layer may, for example, be an oxide layer. The shield and gate electrodes are also isolated from silicon in the mesa by dielectric layers (e.g., shield dielectric and gate dielectric layers).

To ensure proper electrical contact of every cell, a "planar stripe" structure is often used for trench MOSFETS fabricated on a semiconductor die surface. In the planar stripe structure, a gate electrode ("gate") and a shield electrode ("shield plate") within a trench (e.g., a linear trench) are disposed to run along (e.g., aligned along) a length of the trench in a longitudinal stripe. Trenches that include the gate electrode and the shield electrode can be referred to as active trenches. The gate electrode (e.g., made with gate poly) is disposed along the length of the active trench on top of (or above) the shield electrode (e.g., made with shield poly). The gate poly in the active trench is exposed and contacted at a stripe end by a gate runner (e.g., gate metal) and the shield electrode (shield poly) in the trench can be exposed and brought up to the surface (using a masking step) at a location along the length of the active trench for contact by a source metal. In FIG. 3, the gate contacts, source contacts, and shield contacts for LS MOSFET 220 formed in active area 310 are schematically represented by gate contact area 312, source contact area 314, and shield contact area 316 on the surface of semiconductor die 300. Further in FIG. 3, the gate contacts, source contacts, and shield contacts for snubber transistor 234 formed in active area 320 are schematically represented by gate contact area 322, source contact area 324, and shield contact area, 326 on the surface of semiconductor die 300. Drain contacts for the devices (LS MOSFET 220, snubber transistor 234) that may be formed on a back surface of semiconductor die 300 are not visible in the top plan view of semiconductor die 300 shown in FIG. 3.

Figure 4:
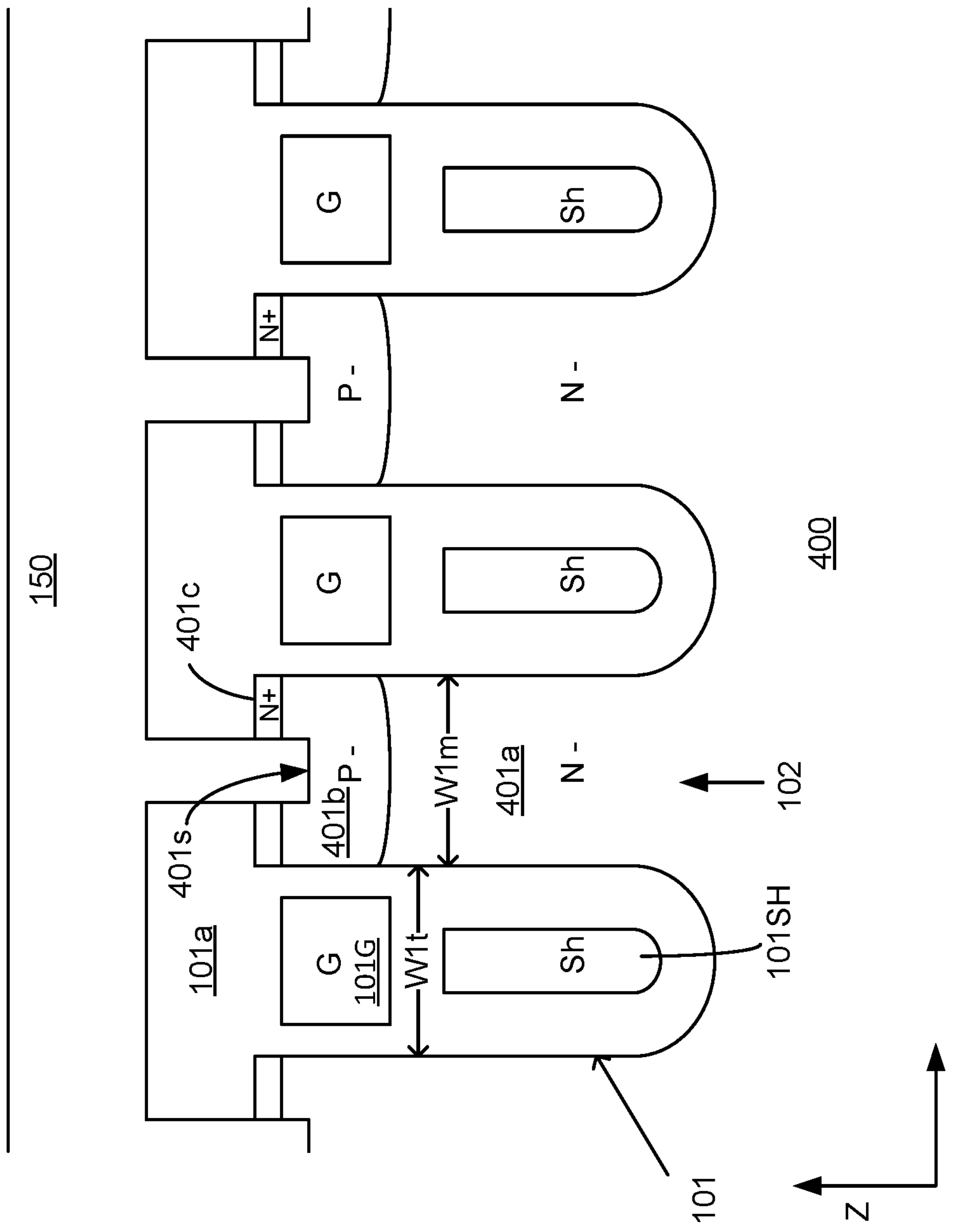
FIG. 4 illustrates, in a cross-sectional view, a portion of an example device.

FIG. 4 shows, in a cross-sectional view, a portion of an example device 400 (e.g., LS MOSFET 220, or snubber transistor 234) in the Z-Y plane across, for example, three trenches 101 in active area 310 (taken along line B-B in FIG. 3). As shown in FIG. 4, in device 400, trench 101 may include a gate electrode G (e.g., gate 101G), and a shield electrode SH (e.g., shield plate 101SH). Trench 101 may be filled with insulating material 101*a* surrounding gate electrode G (gate 101G) and shield electrode SH (e.g., shield plate 101SH). Further, mesas 102 (formed between pairs of trenches 101), for example, in active area 310, of device 400 may include MOSFET device regions such as N− drift region 401*a*, P− body region 401*b*, and source region 401*c*. Mesa 102 may include exposed source contact regions or elements 401*s* of device 400 that are in electrical contact with a source contact layer 150. As shown in FIG. 4, trench 101 may have a width W1*t*, and mesa 102 may have a width W1*m*.

In example implementations, semiconductor die 300 may be included in a power converter (e.g., power convertor circuit 100, FIG. 1, and power convertor circuit 200, FIG. 2) having RTC snubber circuit 230 integrated with LS MOSFET 220.

In the foregoing, the snubber circuit is mostly described as being integrated with a LS MOSFET device on a semiconductor die. In example implementations, the snubber circuit may be integrated with a HS MOSFET device on a semiconductor die, or to both a LS MOSFET device and a HS MOSFET device in a power switching circuit (e.g., power convertor circuit 100, FIG. 1) on the same semiconductor die.

Figure 5:
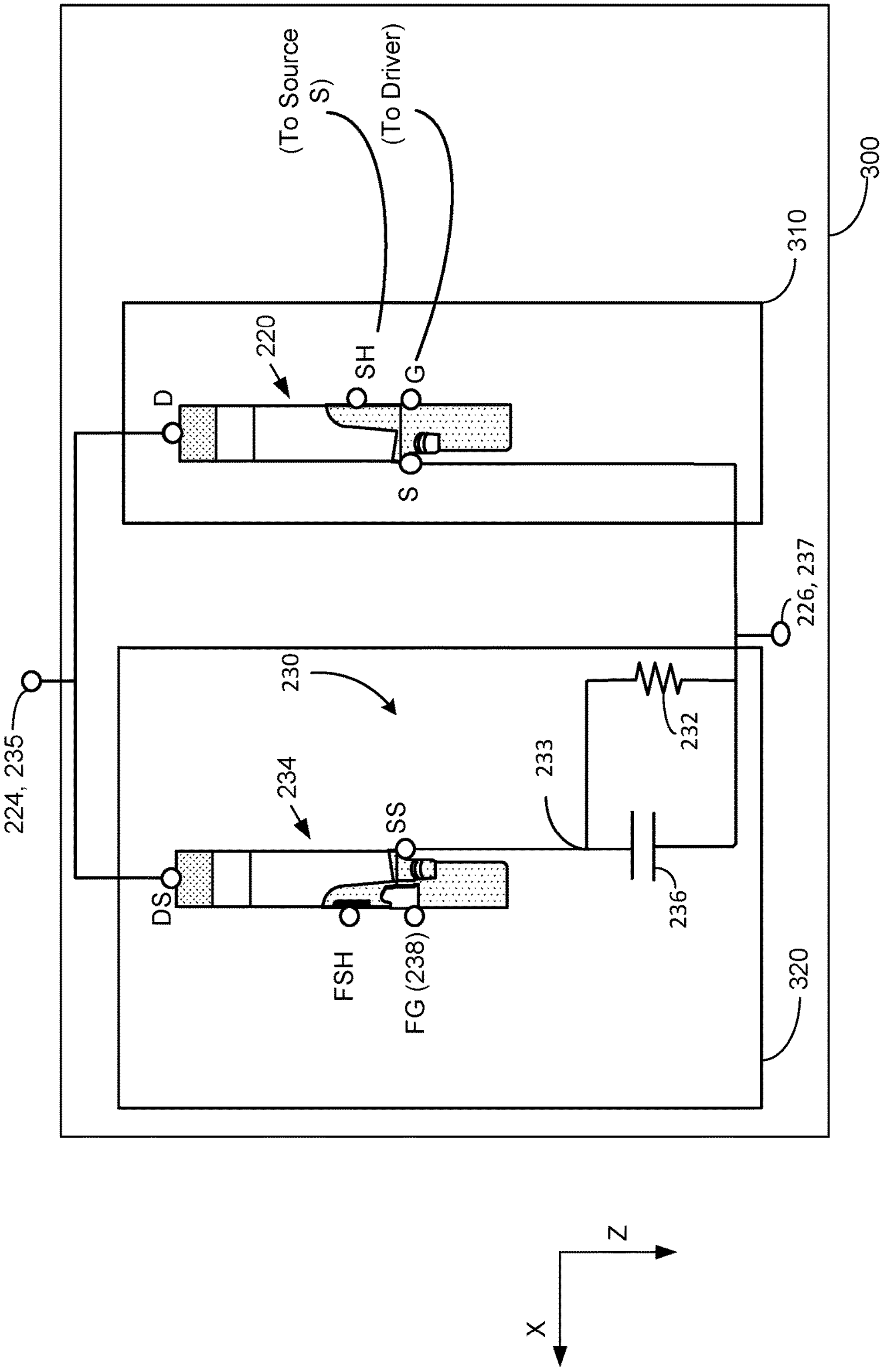
FIGS. 5 through 7 are schematic circuit diagrams of MOSFETs integrated with RTC snubbers.
Figure 6:
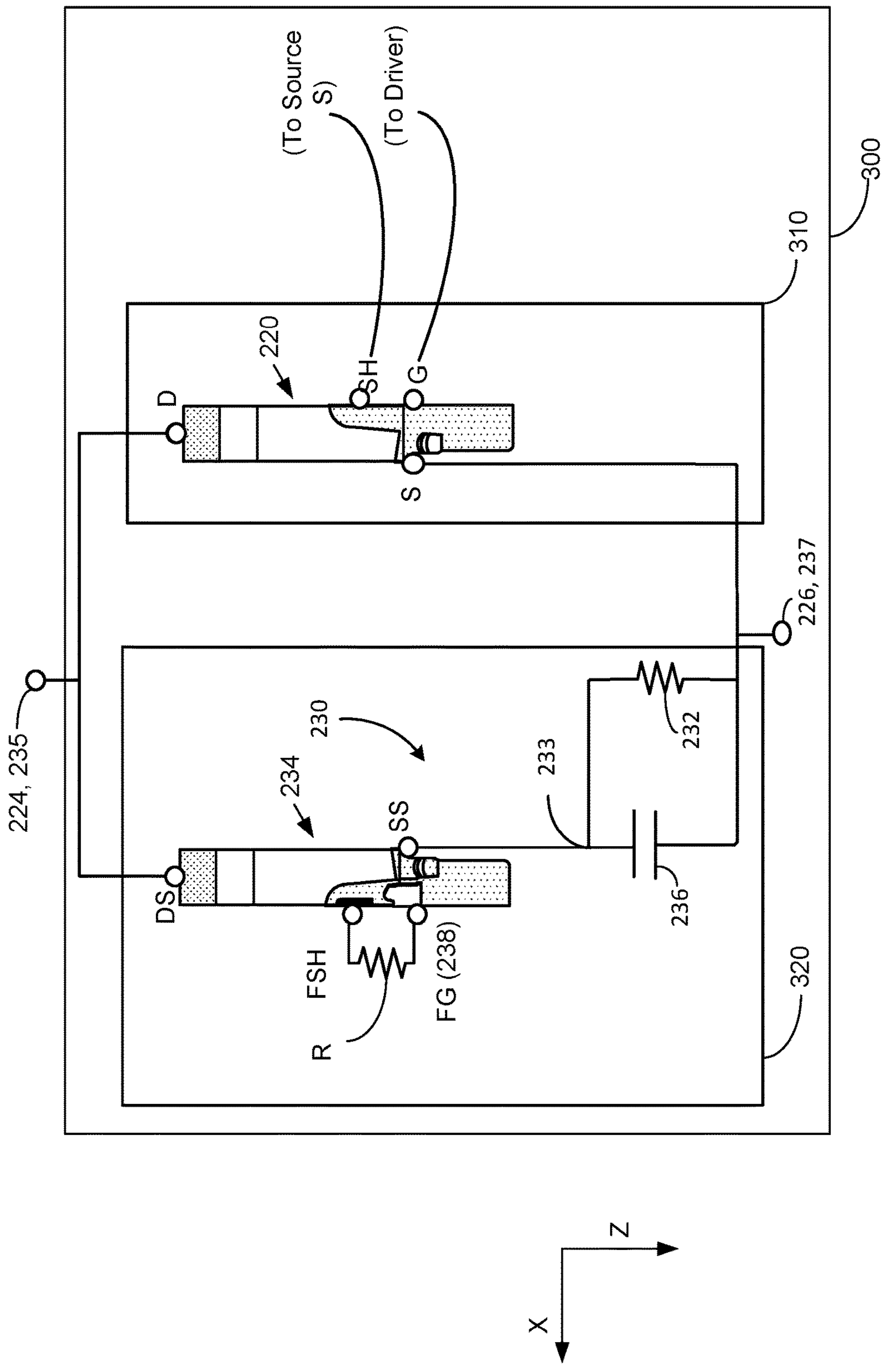

FIGS. 5 through 7 are schematic circuit diagrams of power transistors (MOSFETs) with integrated RTC snubbers (e.g., MOSFET-RTC snubber circuits 500, 600 and 700) that may be utilized in power convertor circuits. MOSFET-RTC snubber circuits 500, 600 and 700 may be implemented with a power transistor (e.g., LS MOSFET 220) integrated with snubber transistor 234 on semiconductor die 300. In FIGS. 5 through 7, the devices (e.g., LS MOSFET 220 and snubber transistor 234) are pictorially represented by a cross sectional view of a half a device cell of the respective devices. It will be noted that the z axis direction for FIGS. 5 through 7 is a reverse of the z axis direction for FIG. 4. Therefore, the cross-sectional views of LS MOSFET 220 and snubber transistor 234 shown in FIGS. 5 through 7 appear with drain side up toward a top of the page in FIGS. 5 through 7.

FIG. 5 shows an example MOSFET-RTC snubber circuit 500 including a RTC snubber circuit (e.g., RTC snubber circuit 230, FIG. 2) integrated with a LS MOSFET transistor (e.g., LS MOSFET 220). MOSFET-RTC snubber circuit 500 may be based on semiconductor die 300 in which LS MOSFET 220 is formed in active area 310 and snubber transistor 234 is formed in active area 320 (FIG. 3). In MOSFET-RTC snubber circuit 500, LS MOSFET 220 may a power device (e.g., a n-type shielded gate vertical MOSFET). A shield gate (plate) SH may be connected to a source S of LS MOSFET 220. Source S of LS MOSFET 220 may be connected to a source node 226, 237 of the converter circuit. A gate G of the LS MOSFET 220 may be connected to a driver circuit (e.g., switching signal) (not shown).

A drain D of the LS MOSFET 220 and a drain DS of snubber transistor 234 may be coupled to a switch node (e.g., drain node 224, 235) in the convertor circuit. A gate (e.g., gate FG, 238) and a shield electrode (e.g., plate FSH) of snubber transistor 234 may be floating (i.e., electrically floating). The floating gate (e.g., gate FG, 238) and the floating shield plate or electrode (e.g., shield plate FSH) of snubber transistor 234 may be only capacitively coupled (e.g., by capacitor 239, FIG. 2) to drain D of LS MOSFET 220. A source SS of snubber transistor 234 may be connected to source node 226, 237 of the converter circuit through the parallel combination of snubber capacitor 236 and snubber resistor 232.

In example implementations, LS MOSFET 220 may have a breakdown voltage BVdss in a range of about 8 to 20 volts (e.g., 10 volts) and configured for a current load (Iload) in a range of 2 A to 40 A (e.g., 15 A). Snubber capacitor 236 may have a value in a range of 1 nF to 5 nF (e.g., 1.2 nF).

In response to a surge in voltage at drain D of the LS MOSFET 220, a capacitively coupled voltage at the floating gate (e.g., gate FG, 238) may be pulled up by the drain potential during MOSFET turn-off.

When this capacitively coupled voltage at the floating gate exceeds a gate-source threshold voltage Vth of the snubber transistor, the snubber transistor may conduct current through the transistor channel to charge snubber capacitor 236 and reduce an overshoot of the voltage at drain D of the LS MOSFET 220. Snubber resistor 232 which is in parallel to snubber capacitor 236, may bleed off a diode leakage current to pin the capacitor at a low voltage Vcap (otherwise, the capacitor will charge to drain potential). In example implementations, snubber capacitor 236 may charge to a lower voltage: Vcap=Vds_MOSFET−Vds_transistor, where Vds_MOSFET is the drain-to-source voltage on the LS MOSFET, and Vds_transistor is the drain-to-source voltage on the snubber transistor. The charge stored in the capacitor is delivered back to the switch node (e.g., drain node 224, 235) through the snubber transistor.

When the voltage value coupled to the floating gate exceeds the gate threshold value the transistor turns to charge the capacitor. When the voltage value coupled to the floating gate falls below the gate threshold value the transistor turns off to stop charging the capacitor.

Operating characteristics of the capacitors, transistors and resistors in the example circuits discussed herein can be determined by design and/or process. That is, respective capacitance values, transistor breakdown (e.g., BVdss) values and resistance values appropriate for a particular implementation can be achieved through layout and sizing, as well as through selection of semiconductor processing parameters, such as doping concentrations, and or material.

In implementations, the LS MOSFET 220 and the snubber transistor 234 can be designed and/or produced such that voltage greater than the BVdss of the LS MOSFET 220 results in a capacitively coupled voltage at the floating gate of the snubber transistor that is greater than the threshold voltage of the snubber transistor. Accordingly, when implemented in a power converter (e.g., power converter circuits 100, 200, 500, 600, or 700) the RTC snubber circuit 230 can operate such that it activates (e.g., snubs voltage and/or current on the switch node) by charging the capacitor 236 to prevent overshoot and/or ringing when a voltage of a corresponding switch node voltage exceeds the drain-to-source breakdown voltage (BVdss) of the LS MOSFET 220. When the voltage on the switch node is below BVdss, snubber resistor 232 can discharge the capacitor 236, and/or can prevent charging of the capacitor 236 by conducting leakage current from capacitor 236. Such operation of the RTC snubber circuit 230 can reduce power conversion efficiency losses in an associated power converter, as compared to previous approaches.

In some example implementations, fabrication process variations (e.g., shield poly deposition, gate poly deposition, etching process variations, etc.) may result in variations in the capacitive coupling between LS MOSFET 220 and the floating gate FG (snubber gate 238) of snubber transistor 234. In example implementations, for better control over the value of the coupled voltage on the floating gate of snubber transistor 234, capacitor or resistor voltage dividers may be included in the RTC snubber circuit (e.g., RTC snubber circuit 230, FIG. 2) integrated with the LS MOSFET transistor (e.g., LS MOSFET 220).

FIG. 6 shows an example converter circuit 600 in which a resistor R (e.g., resistor R) is disposed across the floating gate (e.g., gate FG) and the shield electrode (e.g., plate FSH) of snubber transistor 234 in RTC snubber circuit 230. Voltages on the floating gate (e.g., gate FG) and the shield electrode (e.g., plate FSH) may be related by the connection resistor R. However, the combination of gate FG and plate FSH may remain electrically floating with respect to other portions (e.g., source and drain of the power MOSFET with the poly gate and the poly plate connected between them). The electrically floating combination of gate FG and plate FSH may be capacitively coupled to rest of terminals.

In some example implementations resistor R may be integrated with snubber transistor 234 fabricated in the semiconductor die. In some other implementations, resistor R may be an external resistor (e.g., a discrete resistor) attached to terminals extending from, or to contacts (e.g., gate contact area 312, and shield contact area 316, FIG. 3) on the surface of the semiconductor die. The voltage difference between the floating gate (e.g., gate FG) and the shield electrode (e.g., plate FSH) of snubber transistor 234 may be dominated by the value of resistance R over, for example, process variations in the geometry, structure, or materials (e.g., poly silicon) of the floating gate and the shield electrode.

In some example implementations, a capacitor voltage divider voltage divider may be disposed between a drain of the transistor and a source of the transistor to determine a voltage at the floating gate of the transistor. The capacitor voltage divider disposed between the drain and the source of the snubber transistor can set a voltage at the floating gate proportional to the drain voltage.

FIG. 7 shows an example converter circuit 700 in which a capacitor voltage divider 710 is utilized in RTC snubber circuit 230 for better control over the value of the coupled voltage on the floating gate of snubber transistor 234. In example implementations, capacitor voltage divider 710 may be used by itself or (as shown in FIG. 7) in addition to resistor R that may be disposed between the floating gate (e.g., gate FG) and the shield electrode (e.g., plate FSH) of snubber transistor 234. In example implementations, capacitor voltage divider 710 may include a capacitor C1 and a capacitor C2 in series. As shown in FIG. 7, capacitor C1 may be disposed between drain DS of the snubber transistor and the shield electrode (e.g., plate FSH) of snubber transistor 234. Capacitor C2 may be disposed between the shield electrode (e.g., plate FSH) of the snubber transistor and the source (e.g., source SS) of snubber transistor 234.

In some example implementations (not shown), capacitor C1 may be disposed between drain DS of the snubber transistor and the floating gate (e.g., gate FG) of snubber transistor 234, and capacitor C2 may be disposed between the shield electrode (e.g., plate FSH) of the snubber transistor and the source (e.g., source SS) of snubber transistor 234.

In example implementations, capacitors C1, C2 may be discrete external capacitors (e.g., surface-mount capacitors) that are not integrated with snubber transistor 234 fabricated in the semiconductor die. In some implementations, capacitors C1, C2 may, for example, be multi-layer ceramic capacitors (MLCC).

In example implementation, snubber transistor 234 may have a lower threshold voltage than a threshold voltage of the switching transistors (e.g., LS MOSFET 220, HS MOSFET) in a power convertor circuit. The lower threshold voltage can be achieved, for example, by using a dedicated Pwell implant in fabrication of the snubber transistor in the semiconductor die.

In example implementations, snubber transistor 234 formed in active area 320 may have an enhanced capacitive coupling (e.g., capacitor 239, FIG. 2) to the drain than a capacitive coupling of LS MOSFET 220 formed in active area 310 in semiconductor die 300. The enhanced capacitive coupling of transistor 234 may, for example, be achieved by using deeper trenches, thinner trench liner oxides, etc.

In example implementations, snubber transistor 234 formed in active area 320 may have reduced capacitive coupling to the source S than a capacitive coupling of LS MOSFET 220 formed in active area 310 in semiconductor die 300. The reduced capacitive coupling of transistor 234 to the source may, for example, be achieved by using thicker gate oxide next to N+ regions in the transistor, etc.

Figure 8:
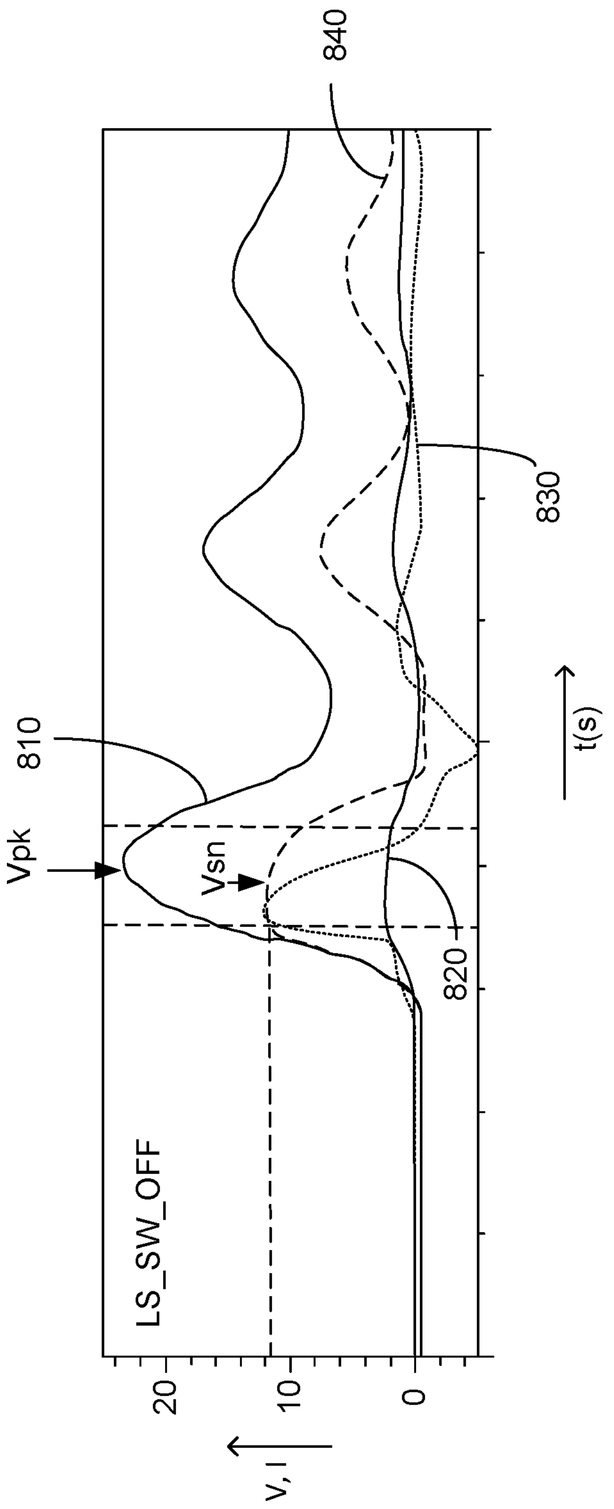
FIG. 8 is a graph schematically illustrating the snubbing of, and the dampening of voltage surges in an example convertor circuit.

FIG. 8 is a graph 800 schematically illustrating the snubbing of, and the dampening of voltage surges in an example convertor circuit (e.g., convertor circuit 500, FIG. 5) in which a RTC snubber circuit (e.g., RTC snubber circuit 230) is used to prevent voltage overshoot and current ringing in a switching transistor (e.g., a LS MOSFET) when the LS MOSFET is switched off. As shown in FIG. 8, graph 800 shows voltage and current curves as a function of time. For example, graph 800 includes a curve 810 representing the drain-to-source voltage ($\upsilon_{DS\_LS\_FET}$) at the LS MOSFET; a curve 820 representing the coupled voltage value ($\upsilon_{GS\_RTC\_FET}$) at the floating gate of the snubber transistor; and a curve 830 representing a drain current ($\upsilon_{D\_RTC\_FET}$) passing through the snubber transistor. Graph 800 further includes a curve 840 representing the drain-to-source voltage ($\upsilon_{DA\_RTC\_FET}$) of the snubber transistor, As seen in graph 800, after the LS MOSFET is switched off, the drain-to-source voltage ($\upsilon_{DS\_LS\_FET}$) at the LS MOSFET (curve 810) can surge to a peak Vpk (of about 22.1 V). This surge voltage peak can be greater than the break down voltage Vdss of the LS MOSFET. As this drain-to-source voltage ($\upsilon_{DS\_LS\_FET}$) surges, voltage ($\upsilon_{GS\_RTC\_FET}$) at the floating gate also rises (curve 820) and turns on the snubber transistor. A current ($i_{D\_RTC\_FET}$) (curve 830) flows through the drain of the snubber transistor and charges the snubber capacitor (snubber capacitor 236) in RTC snubber circuit 230. As a result of the turning on of the snubber transistor the voltage ($\upsilon_{DA\_RTC\_FET}$) at the drain of the snubber transistor is clipped (snubbed) to a lower voltage value. In graph 800, the drain voltage on the snubber transistor is shown by curve 840. In the implementation shown, the peak value Vpk (~22.1 V) of the drain-to-source voltage ($\upsilon_{DS\_LS\_FET}$) (curve 810) may be reduced to a lower snubbed value (Vsn~10V) as seen in curve 840. The activation of RTC snubber circuit 230 as illustrated pictorially in graph 800 of FIG. 8 can result in reduction of overshoot and/or ringing in power switching or converter circuits.

In some example implementations, a diode could be used to replace the transistor in the RTC snubbers described herein to form a resistor-diode-capacitor (RDC) snubber. In a RDC snubber, the snubber capacitor may be charged by avalanche current flow through the diode when a voltage surge at the diode anode exceeds a diode breakdown voltage (BV) (e.g., BV=14V, BV=16V). This avalanche current flow through the diode is significantly less well behaved and less controlled than the current flow through the transistor channel in a RTC snubber. The snubbed value of the voltage (Vsn~11V) at the drain in the RTC snubber can be significantly lower than the snubbed value of the voltage (e.g., Vda~14V, ~16V) at the diode anode in a RDC snubber. Further, a RTC snubber is significantly more effective in smothering dynamic voltage wave forms (e.g., Vds_FET, 840, FIG. 8) than a RDC snubber is effective in smothering dynamic voltage wave forms (e.g., Vdanode_diode). As a result, power loss in the RTC snubber can be significantly reduced compared to the power loss in the RDC snubber due to the more efficient smothering of dynamic waveforms by the RTC snubber (FIG. 8).

In some implementations at least one of the capacitor, and/or resistor of a RTC snubber circuit can be implemented as a discrete element (e.g., a surface-mounted capacitor) that is coupled with a semiconductor device including other circuit elements to produce an integrated transistor and RTC snubber circuit. In some implementations, an integrated transistor and RTC snubber circuit can be implemented using a first semiconductor die including a transistor, such as a LS MOSFET, and second semiconductor die including a RTC snubber circuit, such as the RTC snubber circuit 230. In such implementations, the first semiconductor die and the second semiconductor die can be included, and interconnected, in a single semiconductor device package.

Operating characteristics of the capacitors, transistors, and resistors in the examples of FIGS. 1 to 7 can be determined by design and/or process. That is, respective capacitance values, $BV_{dss}$ values and resistance values appropriate for a particular implementation can be achieved through layout and sizing, as well as through selection of semiconductor processing parameters, such as doping concentrations, and or material. While specific examples are shown in FIGS. 1 to 7, in some implementations, other capacitors, diode and/or resistor implementations can be used. For instance, as some example, diodes can be implemented as Zener diodes, resistors can be implemented as diffusion resistors or metal resistors, and capacitors can be implemented using low-k and/or high-k dielectrics to achieve a desired capacitance value.

A sudden interruption of current flow across an inductive element in a power switching circuit (e.g., when a current switching transistor is turned off) can lead to a large counter-electromotive force causing a rise or surge in voltage across the current switching device that opposes the change in current. If the surge in voltage generated across the current switching transistor is beyond what the switching transistor is intended to tolerate, it may damage or destroy it. A method for suppressing or reducing the surge in voltage across the current switching transistor, a snubber circuit can provide a short-term alternative current path around the current switching transistor so that the inductive element may be safely discharged.

Figure 9:
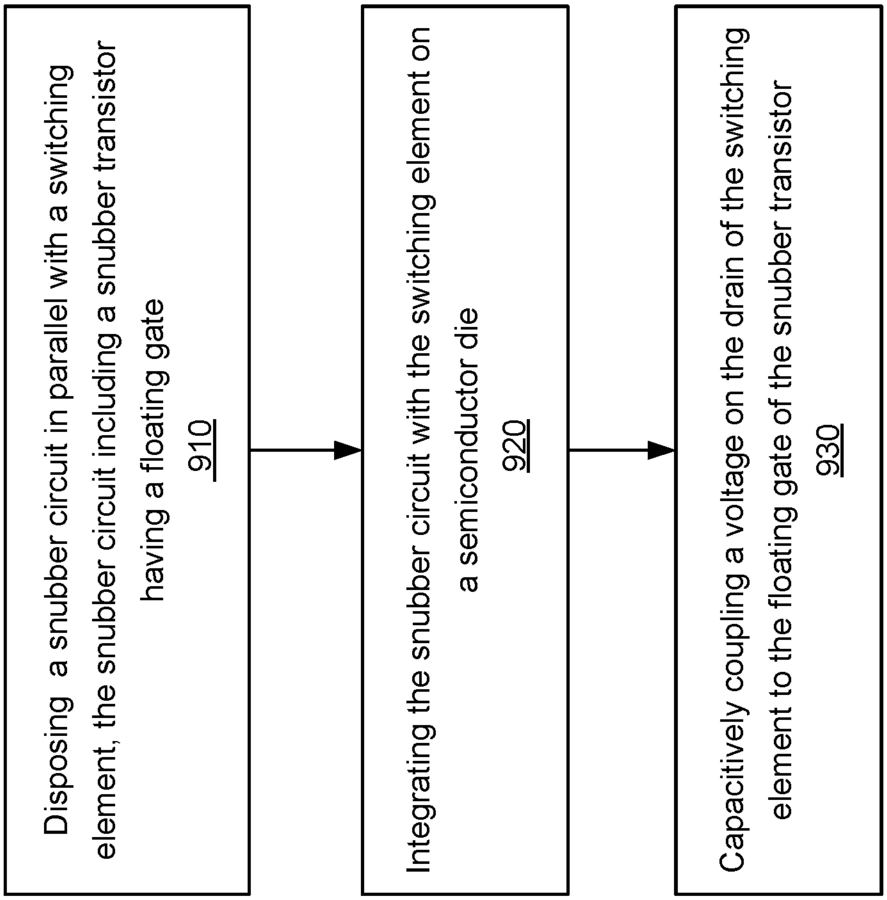
FIG. 9 illustrates an example method for snubbing voltage surges in a switching circuit.

FIG. 9 shows a method 900 for reducing (snubbing) voltage surges in a switching circuit to avoid breakdown of the switching elements in the circuit. The switching elements may, for example, include a power MOSFET (e.g., a LS MOSFET switch and or a HS MOSFET switch).

Method 900 includes disposing a snubber circuit in parallel with a switching element, the snubber circuit including a snubber transistor having a floating gate (910); and monolithically integrating the snubber circuit with the switching element on a semiconductor die (920). The switching element may, for example, be a power MOSFET device having a source, a drain, and a gate. The snubber transistor may also be a MOSFET device with a source and a drain and the floating gate. The snubber circuit may include a capacitor connected in series to the source of the snubber transistor and resistor (e.g., a bleeding resistor) connected in parallel the capacitor.

Monolithically integrating the snubber circuit with the switching element on the semiconductor die can include fabricating the switching element (e.g., a MOSFET) in a first active area on the semiconductor die, and fabricating the snubber transistor (e.g., a MOSFET) in a second active area of the semiconductor die.

In method 900, monolithically integrating the snubber circuit with the switching element on the semiconductor die can include capacitively coupling a voltage on the drain of the switching element to the floating gate of the snubber transistor (930). When the capacitively coupled voltage on the floating gate exceeds the gate threshold voltage of the snubber transistor, the snubber transistor may conduct current to charge the capacitor providing an alternative current path around the switching element.

In some example implementations, method 900 may further include disposing a capacitor voltage divider between a drain and a source of the snubber transistor to determine a value of a voltage coupled to the floating gate.

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Gallium Arsenide (GaAs), Silicon Carbide (SiC), and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. As used herein, coupled to, or coupled with can refer to being electrically coupled to, electrically coupled with, physically coupled to, and/or physically coupled with.

Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A circuit comprising:

a metal-oxide semiconductor field-effect transistor (MOSFET), formed in a first active area of a die, and including a gate, a source, and a drain; and a snubber circuit coupled between the drain and the source, the snubber circuit including:

a transistor disposed in parallel to the MOSFET, the transistor having a floating gate and being formed in a second active area of the die, the transistor being a shielded gate vertical trench transistor having a floating shield plate;

a capacitor in series with the transistor;

a first resistor disposed parallel to the capacitor; and a second resistor directly connected to the floating gate and the floating shield plate.

2. The circuit of claim 1, wherein the drain of the MOSFET is capacitively coupled to the floating gate of the transistor such that a voltage at the drain of the MOSFET couples a voltage value to the floating gate.

3. The circuit of claim 2, wherein the transistor has a gate-source threshold voltage, and wherein when the voltage value coupled to the floating gate exceeds the gate-source threshold voltage of the transistor, the transistor turns on to charge the capacitor.

4. The circuit of claim 3, wherein the first resistor conducts leakage current to reduce or prevent charging of the capacitor.

5. The circuit of claim 2, wherein the capacitor charges to a voltage (Vcap) up to a difference in a drain-to-source voltage of the MOSFET and a drain-to-source voltage of the transistor.

6. The circuit of claim 2, wherein when the voltage value coupled to the floating gate falls below a gate threshold value the transistor turns off to stop charging the capacitor.

7. The circuit of claim 1, wherein the second active area is less than fifteen percent of the first active area.

8. The circuit of claim 1, wherein a capacitor voltage divider is disposed between a drain of the transistor and a source of the transistor to determine a voltage at the floating gate of the transistor.

9. The circuit of claim 1, wherein the transistor is a shielded gate vertical trench MOSFET.

10. A semiconductor die comprising:

a metal-oxide semiconductor field-effect transistor (MOSFET) including a gate, a source, and a drain;

a snubber circuit including a transistor disposed in parallel to the MOSFET between the source and the drain, the transistor having a floating gate, the transistor being a shielded gate vertical trench transistor having a floating shield plate; and a resistor directly connected to the floating gate and the floating shield plate.

11. The semiconductor die of claim 10, wherein the MOSFET is fabricated in a first active area and the transistor is fabricated in a second active area of the semiconductor die, the second active area being less than 15 percent of the first active area.

12. The semiconductor die of claim 10, wherein the resistor is a first resistor and wherein the snubber circuit further comprises:

a capacitor in series with and directly coupled to the transistor; and a second resistor disposed parallel to the capacitor.

13. The semiconductor die of claim 12, wherein the capacitor and the resistor are monolithically integrated with the transistor on the semiconductor die.

14. The semiconductor die of claim 10, wherein the snubber circuit further comprises a capacitor voltage divider between a drain and a source of the transistor to set a voltage at the floating gate.

15. A method comprising:

disposing a snubber circuit in parallel with a switching element, the snubber circuit including a snubber transistor having a floating gate, the snubber transistor being a shielded gate vertical trench transistor having a floating shield plate;

integrating the snubber circuit with the switching element on a semiconductor die; and capacitively coupling a voltage on a drain of the switching element to the floating gate of the snubber transistor; and directly connecting a resistor to the floating gate and the floating shield plate.

16. The method of claim 15, wherein the switching element is a MOSFET fabricated in a first area of the semiconductor die and the snubber transistor is fabricated in a second area of the semiconductor die, the second area being less than 15 percent of the first area.

17. The method of claim 15, wherein the resistor is a first resistor, and wherein the snubber circuit further comprises:

a capacitor in series with the snubber transistor; and a second resistor disposed parallel to the capacitor.

18. The method of claim 15, further comprising disposing a capacitor voltage divider between a drain and a source of the snubber transistor to set a voltage at the floating gate.

19. The circuit of claim 1, wherein the MOSFET and the snubber circuit are monolithically integrated in the die, the second active area being less than the first active area.

* * * * *